United States Patent [19]
Watanabe et al.

[11] Patent Number: 6,101,151
[45] Date of Patent: Aug. 8, 2000

[54] SYNCHRONOUS SEMICONDUCTOR MEMORY DEVICE EMPLOYING TEMPORARY DATA OUTPUT STOP SCHEME

[75] Inventors: Naoya Watanabe; Yoshikazu Morooka; Tsutomu Yoshimura; Yasunobu Nakase, all of Hyogo, Japan

[73] Assignee: Mitsubishi Denki Kabushiki Kaisha, Tokyo, Japan

[21] Appl. No.: 09/196,245

[22] Filed: Nov. 20, 1998

[30] Foreign Application Priority Data

Jun. 12, 1998 [JP] Japan .................................. 10-165256

[51] Int. Cl.[7] .................................................. G11C 8/00
[52] U.S. Cl. ...................................... 365/233; 365/189.05
[58] Field of Search .............................. 365/189.05, 233, 365/291, 189.01

[56] References Cited

U.S. PATENT DOCUMENTS 5,699,302  12/1997  Shinozaki et al. ................. 365/189.05
5,708,614   1/1998  Koshikawa .............................. 365/201
5,805,506   9/1998  Matsui ................................ 365/189.05

FOREIGN PATENT DOCUMENTS 9-153282   6/1997  Japan .
58-051325  3/1998  Japan .

*Primary Examiner*—Son Mai
*Attorney, Agent, or Firm*—McDermott, Will, & Emery

[57] ABSTRACT

In a synchronous semiconductor memory device in which an internal clock signal from an internal timing clock signal generating circuit is branched in the form of a tree by driver circuits and applied to output buffers and data are output in synchronization with the internal clock signal, the driver circuit of the first stage is constituted by an NAND gate and an inverter. When output is to be temporarily stopped, an enabling signal is set to "L" level, so that the NAND gate is closed, output of the clock signal to each driver circuit is stopped, and thus power consumption is reduced.

5 Claims, 13 Drawing Sheets

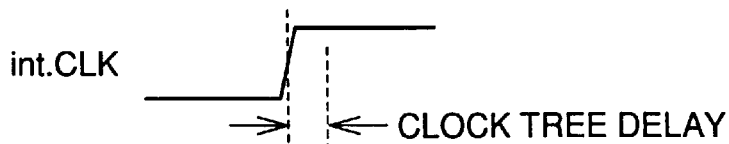
FIG.11A PRIOR ART   int.CLK
FIG.11B PRIOR ART   clk<0>
←— CLOCK TREE DELAY
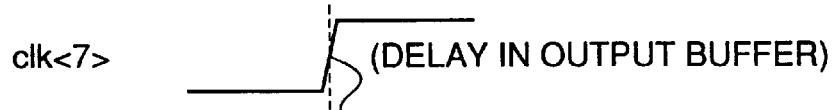
FIG.11C PRIOR ART   clk<7>
(DELAY IN OUTPUT BUFFER)
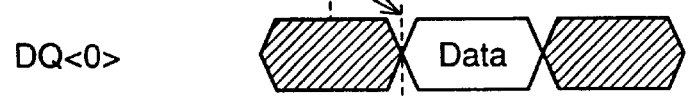
FIG.11D PRIOR ART   DQ<0>
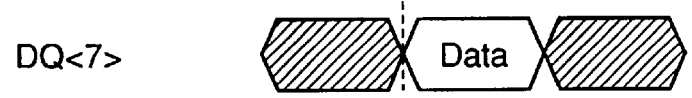
FIG.11E PRIOR ART   DQ<7>

FIG.13A PRIOR ART ext.CLK

FIG.13B PRIOR ART Command (Read)

FIG.13C PRIOR ART DQML

FIG.13D PRIOR ART DQMU

FIG.13E PRIOR ART clk<0:7>

FIG.13F PRIOR ART clk<8:15>

SYNCHRONOUS SEMICONDUCTOR MEMORY DEVICE EMPLOYING TEMPORARY DATA OUTPUT STOP SCHEME

BACKGROUND OF THE INVENTION

1. Field of the Invention

The present invention relates to a synchronous semiconductor memory device. More specifically, the present invention relates to a synchronous semiconductor memory device including a buffer circuit for temporarily stopping data output from a plurality of output terminals in response to an external control signal.

2. Description of the Background Art

In a synchronous semiconductor memory device, data is input/output in synchronization with a clock signal input to the synchronous semiconductor memory device. Therefore, in such a synchronous semiconductor memory device, a clock signal generated from an external clock generating circuit for determining input or output timing is distributed to a plurality of data input/output buffers.

FIG. 8 shows a conventional circuit for distributing a clock to output buffers. Referring to FIG. 8, an internal timing clock generating circuit 1 generates, from an external clock signal ext.CLK, an internal clock signal int.CLK and distributes the generated clock signal to all output buffers 10 to 25. Data int.D<0> to int.D<15> are applied to respective output buffers 10 to 25.

In FIG. 8, an internal clock signal as a trigger for outputting data DQ<0> is referred to as clk<0>, and an internal clock signal as a trigger for outputting DQ<7> is referred to as clk<7>. Output buffers 10 to 17 output data DQ<0> to DQ<7> in synchronization with internal clock signals clk<0> to clk<7>, respectively. Similarly, output buffers 18 to 25 output data DQ<8> to DQ<15> in synchronization with internal clock signal int.CLK.

FIGS. 9A to 9D are timing charts of output data DQ<0>, DQ<7> and internal clock signals clk<0> and clk<7> shown in FIG. 8. As shown in FIGS. 9A to 9D, the time necessary for the internal clock signal int.CLK to propagate to respective output buffers differ dependent on the distance between internal timing clock generating circuit 1 and each of the output buffers 10 to 25, and therefore there is generated a skew from pin to pin in the output timing of data DQ from one same chip. If the frequency is made higher, the pin to pin skew comes to occupy larger ratio in one period, reducing timing margin for input at a controller receiving the data output from the memory. Therefore, the pin to pin skew may cause system failure.

A binary tree structure for branching the internal clock int.CLK such as shown in FIG. 10 has been proposed as means for eliminating the pin to pin skew. Referring to FIG. 10, an output from internal timing clock generating circuit 1 is divided into two by a driver circuit drv0, further divided into two by each of driver circuits drv2 and 3, and further divided into two by each of driver circuits drv6 to drv9 and applied to output buffers 10 to 17. Similarly, internal clock signal int.CLK is divided into two by driver circuit drv1, further divided into two by each of driver circuits drv4 and 5, and further divided into two by each of driver circuits drv10 to drv13 and applied to output buffers 18 to 25.

FIGS. 11A to 11E are timing charts of data output in the binary clock distributing circuit shown in FIG. 10. As can be seen from the timing charts of FIGS. 11A to 11C, internal clock signals clk<0> and clk<7> have the same propagation delay, and therefore there is not a pin to pin skew in output data DQ<0> and DQ<7>.

However, in the binary tree structure, driver circuits drv0 to drv13 are necessary at tree branching points, and therefore power consumption of the tree as a whole is considerably large. Further, in a synchronous semiconductor memory device having data input/output pins of 16 bits or more, a function referred to as byte control is provided, for masking lower or upper 8 bits of data at the time of reading or writing.

FIG. 12 is a block diagram showing a structure of a data output portion having binary tree structure with the byte control function provided additionally. Referring to FIG. 12, an input for byte control is provided commonly to output buffers 30 to 37 and 38 to 45, and by activating a DQML or DQMU signal, output is set to a high impedance state and stopped.

FIGS. 13A to 13H are timing charts of data output at the time of byte control of the output buffers shown in FIG. 12. As shown in FIG. 13C, when the signal DQML is activated, that is, set to the "H" (high) level, outputs of DQ<0> to DQ<7> are set to the high impedance state as shown in FIG. 13G in synchronization with a rise of internal clocks clk<0:7> shown in FIG. 13E, and when the signal DQMU shown in FIG. 13D is set to the "H" level, data outputs DQ<8> to DQ<15> are set to the high impedance state as shown in FIG. 13H in synchronization with internal clocks clk<8:15> shown in FIG. 13F.

FIG. 14 is a specific circuit diagram of the output buffer shown in FIG. 12. Referring to FIG. 14, data int.D<n> is applied to the drain and internal clock signal int.clk<n> is applied to the gate of n channel MOS transistor 301 of output buffer 30. When transistor 301 turns on in response to the internal clock signal, data is latched in a latch circuit consisting of inverters 302 and 303 connected to the emitter of the transistor. An output from the latch circuit is applied to one input end of an AND gate 306, and applied, inverted by inverter 304, to one input end of an NAND gate 305.

To the other input end of NAND gate 305 and to the other input end of AND gate 306, the signal DQML or DQMU is applied. An output of NAND gate 305 is applied to the gate of a p channel MOS transistor 307, an output of AND gate 306 is applied to the gate of an n channel MOS transistor 308, and output signal DQ<n> is output from the drains of transistors 307 and 308. A power supply is connected to the source of transistor 307, while the source of transistor 308 is grounded.

In the output circuit having such a binary clock tree structure shown in FIG. 12, when byte control is performed by setting the signal DQML to "H" level to stop output of lower 8 bits, operation of output buffers 30 to 37 of lower 8 bits is stopped. However, 7 driver circuits drv0, drv2, drv3, drv6, drv7, drv8 and drv9 supplying the internal clock signal to the output buffers 30 to 37 operate continuously, consuming power.

Further, even when the binary tree structure is employed, pin to pin skew cannot always be eliminated because of process variation of the chip, or because of the difficulty in realizing perfectly symmetrical layout.

SUMMARY OF THE INVENTION

Therefore, an object of the present invention is to provide a synchronous semiconductor memory device allowing reduction of power consumption, by stopping clock driver circuits in the binary clock tree block.

Briefly stated, the present invention provides a synchronous semiconductor memory device for temporarily stopping output of data from a plurality of output terminals by an external control signal at the time of input or output of continuous data, in which a clock signal is branched by a clock signal supplying circuit and applied to a plurality of buffer circuits, each buffer circuit outputs data based on a clock signal, and supply of the clock signal is stopped by a supply stop circuit in accordance with an external control signal.

Therefore, according to the present invention, power consumption is reduced as supply of the clock signal is stopped in accordance with the external control signal. Further, when input or output of a plurality of bits are to be stopped with input/output control performed bit by bit, the block of which operation is to be stopped can arbitrarily be selected, and power consumption of the clock supplying circuit can be reduced.

More preferably, a plurality of driver circuits are provided for each branch of the clock signal supplying circuit, and the supply stop circuit is provided at a first stage of the driver circuits.

More preferably, a plurality of driver circuits are provided for each branch of the clock signal supplying circuit, and the supply stop circuit is provided on an input side of each driver circuit.

More preferably, the supply stop circuit stops supply of the clock signal byte by byte or bit by bit, in accordance with a control signal.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 11A to 11E are timing charts showing timing of data outputs in accordance with the example shown in FIG. 10.

FIGS. 13A to 13H are timing charts showing timing of data outputs at the time of byte control shown in FIG. 12.

FIG. 14 is a circuit diagram showing an example of a conventional output buffer.

DESCRIPTION OF THE PREFERRED EMBODIMENTS

Figure 1:
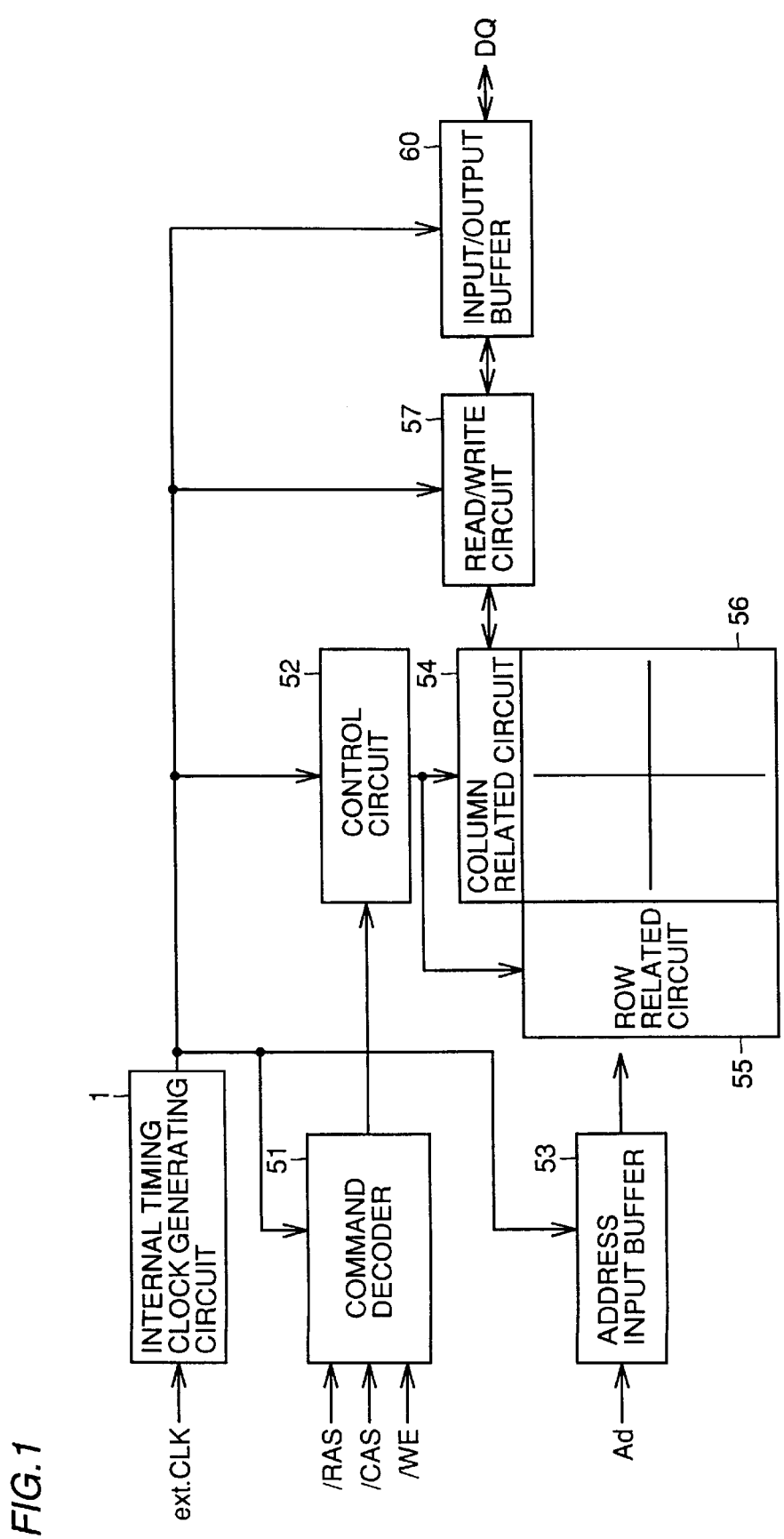
FIG. 1 is a block diagram showing an overall structure of the synchronous semiconductor memory device to which the present invention is applied.

FIG. 1 is a block diagram showing an overall structure of the synchronous semiconductor memory device to which the present invention is applied. Referring to FIG. 1, an external clock signal ext.CLK is applied to internal timing clock generating circuit 1, from which an internal clock signal int.CLK is generated and applied to a command decoder 51, a control circuit 52, an address input buffer 53, a write/read circuit 57 and an input/output buffer 60. A row address strobe signal /RAS, a column address strobe signal /CAS and a write enable signal /WE are applied externally to command decoder 51, and a command signal is applied to control circuit 52.

An address signal Ad is applied to address input buffer 53, and an X address signal and a Y address signal for designating X and Y addresses of a memory cell 56 are output. A column related circuit 54 designates the Y address of memory cell 56 based on the Y address signal, in response to a control signal from control circuit 52, while a row related circuit 55 designates the X address of memory cell 56 based on the X address signal in response to the control signal from control circuit 52. Write/read circuit 57 outputs data read from memory cell 56 to input/output buffer 60, and applies write data received from input/output buffer 60 to memory cell 56. One embodiment of the present invention is applied to input/output buffer 60 which outputs data to the outside, and applies data from the outside to write/read circuit 57.

Figure 2:
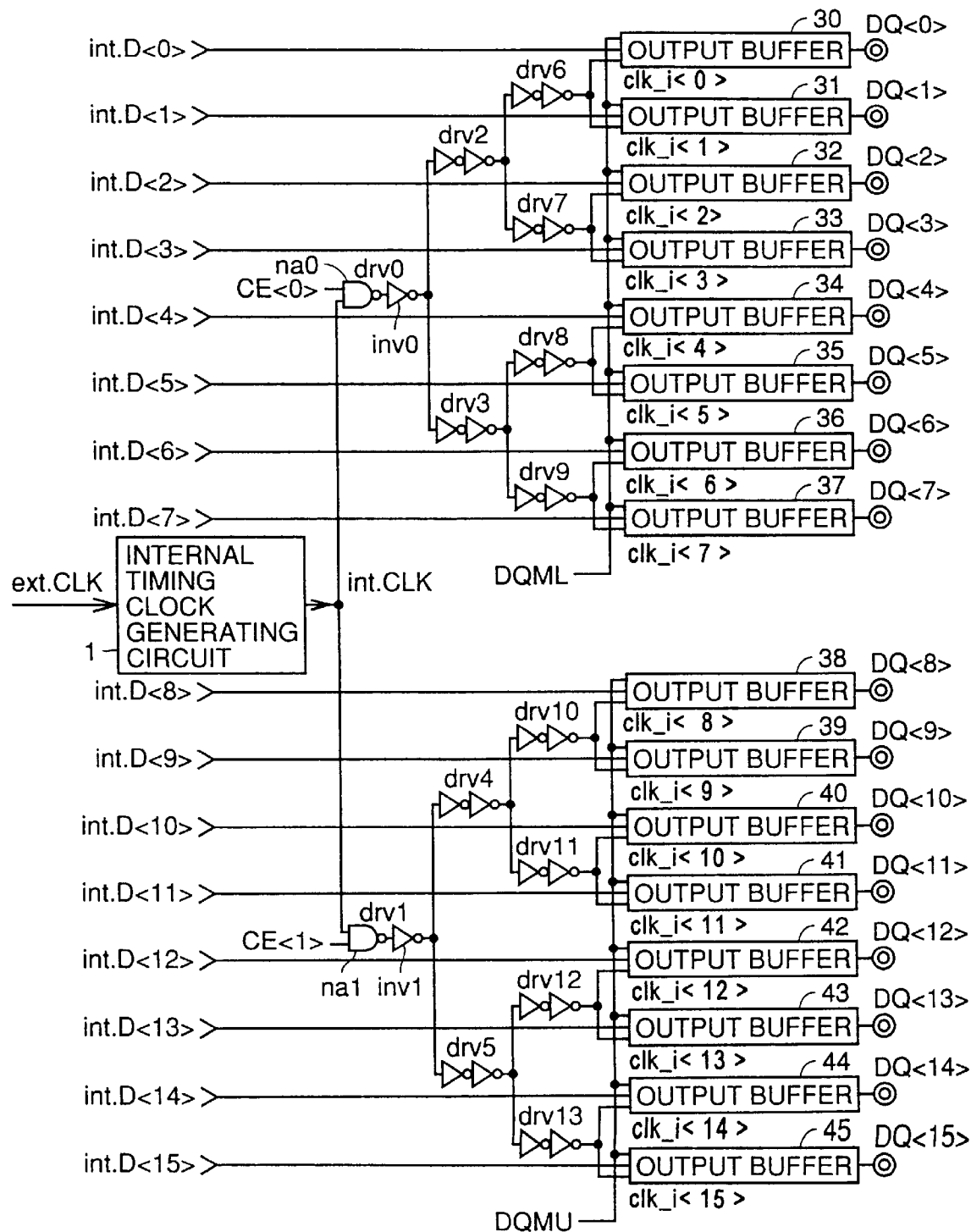
FIG. 2 is a block diagram showing a binary clock buffer and an output buffer allowing byte control, in accordance with one embodiment of the present invention.

FIG. 2 is a block diagram of one embodiment of the present invention. Referring to FIG. 2, driver circuits drv0 and drv1 of the first stage of the binary tree include NAND gates na0 and na1 and inverters inv0 and inv1, respectively. Internal clock signal int.CLK is input to one input end of NAND gates na0 and na1, and clock driver circuit enabling signals CE<0> and CE<1> are input to the other input end, respectively. In normal operation when all of the output buffers 30 to 45 output data, clock driver circuit enabling signals CE<0> and CE<1> are fixed at the "H" level.

Figure 3:
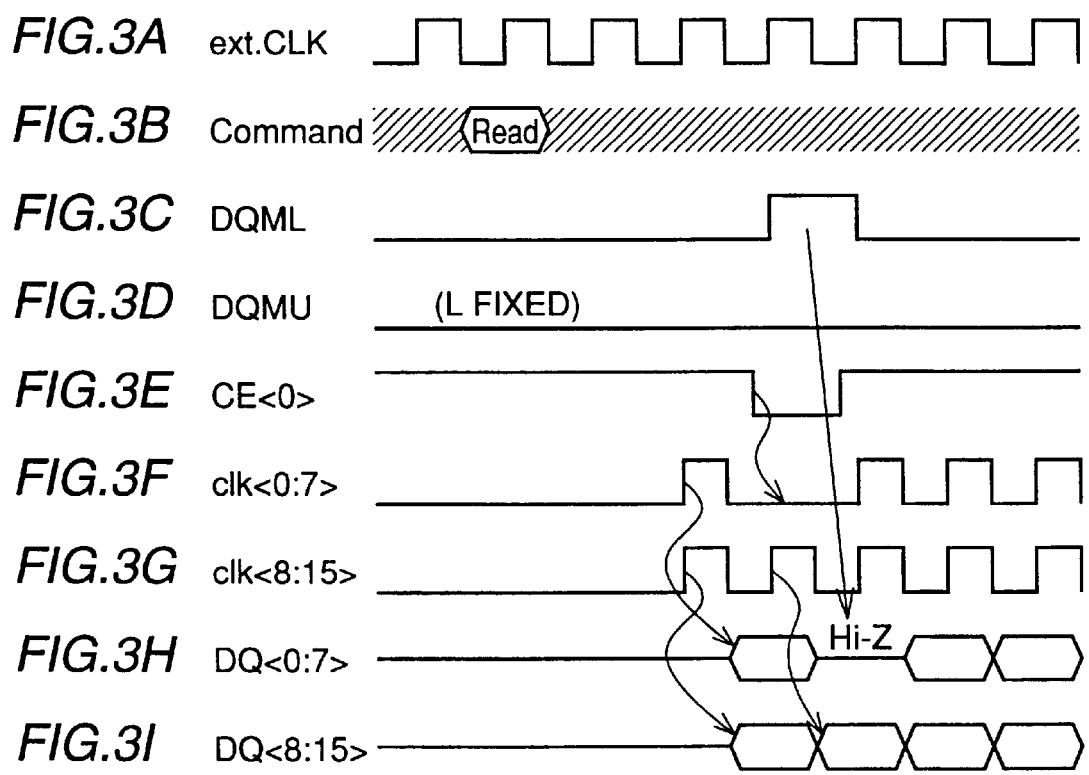
FIGS. 3A to 3I are timing charts of internal clock signals and data outputs at the time of byte control in accordance with the embodiment shown in FIG. 2.

FIGS. 3A to 3I are timing charts at the time of reading of the data output circuit shown in FIG. 2. FIGS. 3A to 3I show the operation at the time of byte control in which data output of lower 8 bits (1 byte) of DQ<0> to DQ<7> shown in FIG. 3H is temporarily stopped at the time of reading and output is set to the high impedance state. By the signal DQML shown in FIG. 3C, data outputs DQ<0> to DQ<7> shown in FIG. 3H are set to the high impedance state, and by setting the clock driver circuit enabling signal CE<0> shown in FIG. 3E to the "L" level, internal clock signals clk<0> to clk<7> shown in FIG. 3F are stopped. When the clock signal of driver circuit drv0 is fixed at "L", driver circuits drv2, drv3, drv6, drv7, drv8 and drv9 following the driver circuit drv0 of the first stage are stopped, and therefore current consumption of the clock tree is reduced. In the similar manner, by adopting the above described embodiment in clock signal distribution for data input, power consumption can be reduced.

Figure 4:
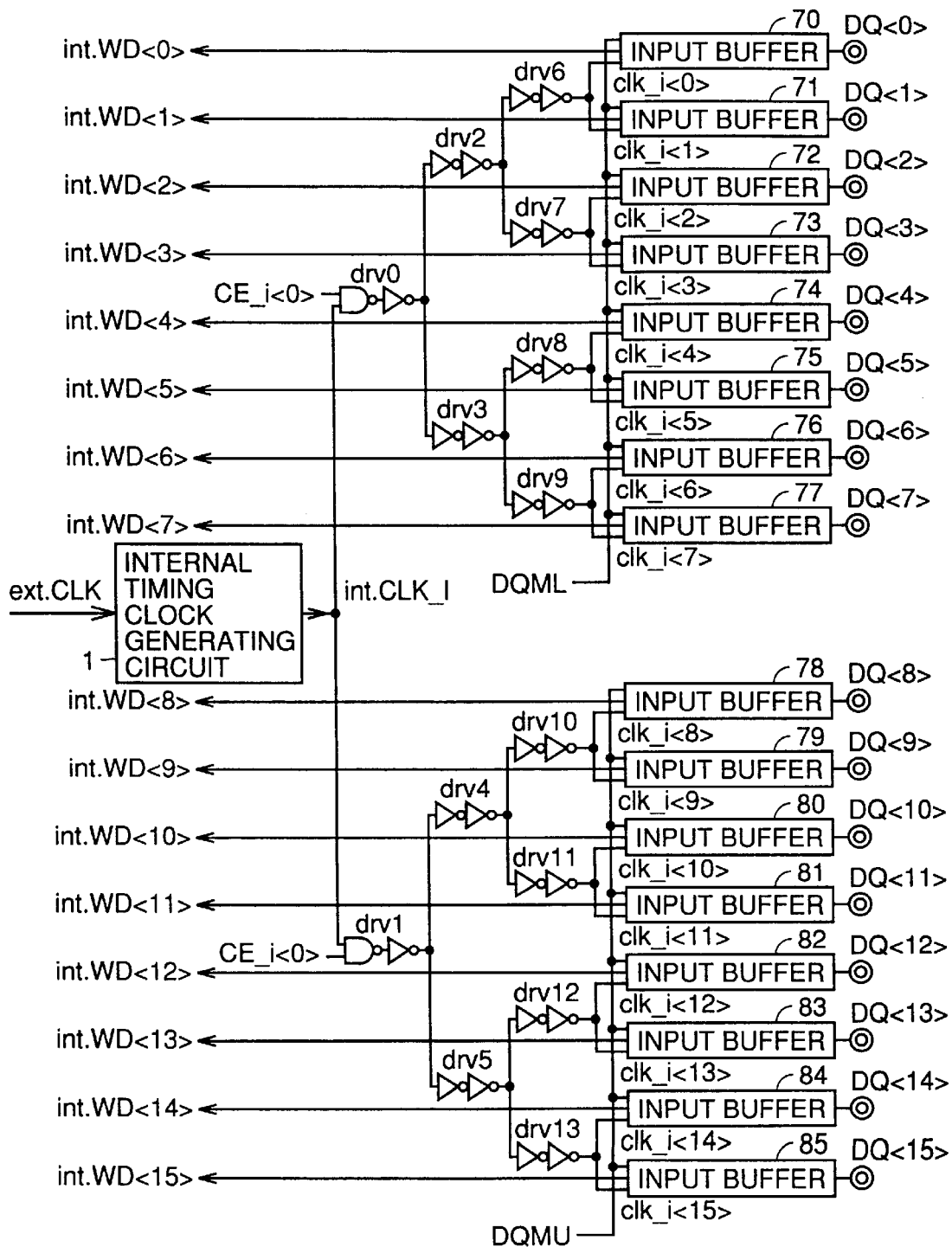
FIG. 4 is a block diagram of a binary clock buffer and an input buffer allowing byte control in accordance with one embodiment of the present invention.

FIG. 4 is a block diagram of input buffers for data input. The example shown in FIG. 4 corresponds to FIG. 2 with output buffers 30 to 45 replaced by input buffers 70 to 85. Except this point, the structure is the same as that of FIG. 2.

Figure 5:
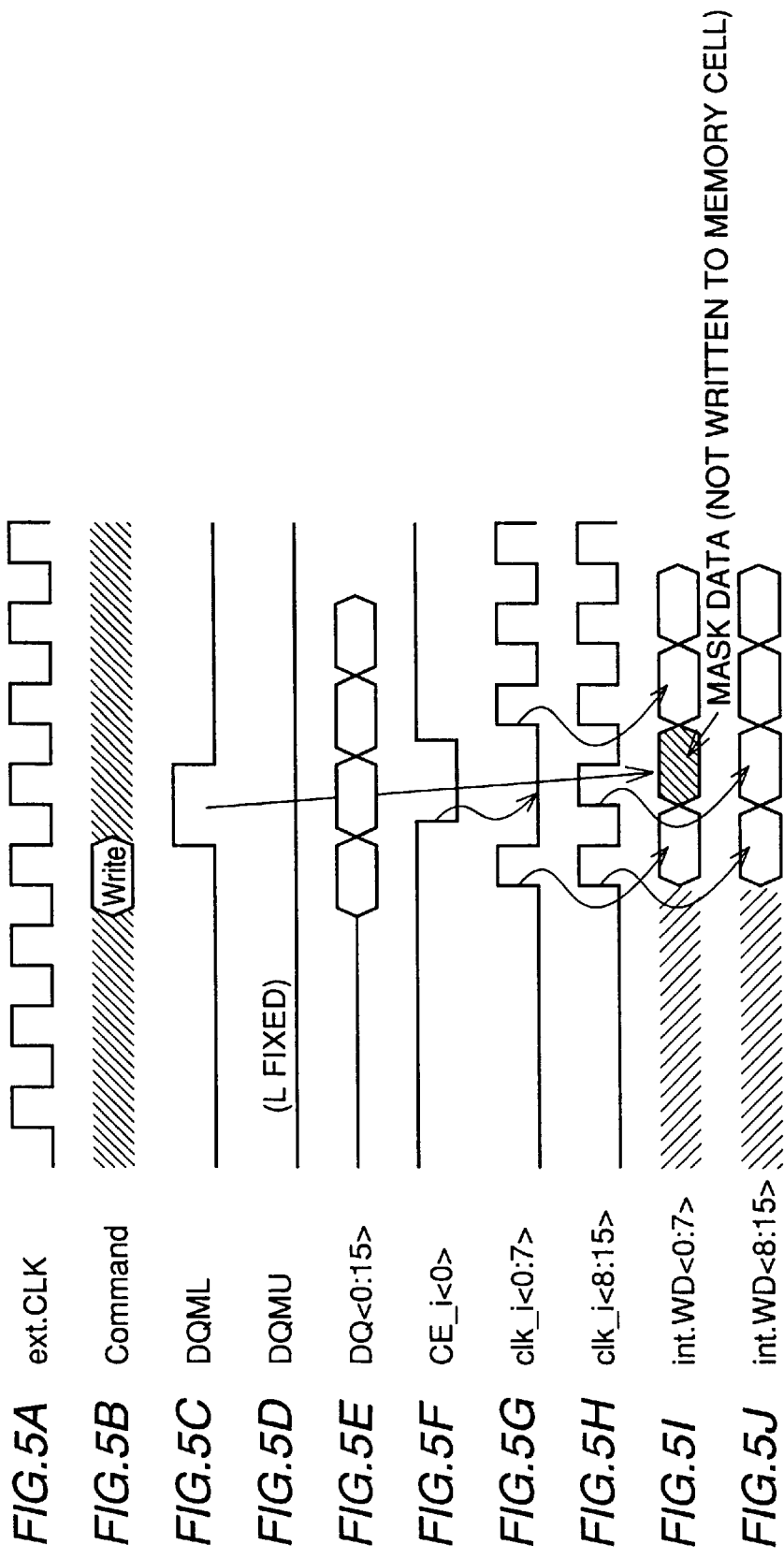
FIGS. 5A to 5J are timing charts showing timings of internal clock signals and data inputs at the time of byte control in accordance with the embodiment shown in FIG. 4.

FIGS. 5A to 5J are timing charts related to the operation of the input buffers shown in FIG. 4. Referring to FIG. 5C, when the signal DQML is at the "H" level, input of data DQ<0> to DQ<15> of FIG. 5E are masked as shown in FIG. 5I, and not written to memory cell 56 shown in FIG. 1. Accordingly, the clock signal to the input buffer which is masked is in wasteful operation. Therefore, by utilizing the clock driver circuits drv0 and dlv1 at the branching points constituted by NAND gates na0 and na1 and inverters inv0 and inv1, by masking input data by the signal DQML or DQMU, the operation of the clock tree corresponding to internal clock signals clk i<0> to clk i<7> shown in FIG. 5G or internal clock signals clk i<8> to clk i<15> shown in FIG. 5H is stopped. Accordingly, the power consumption of the tree as a whole when the data is masked, can be reduced.

Figure 6:
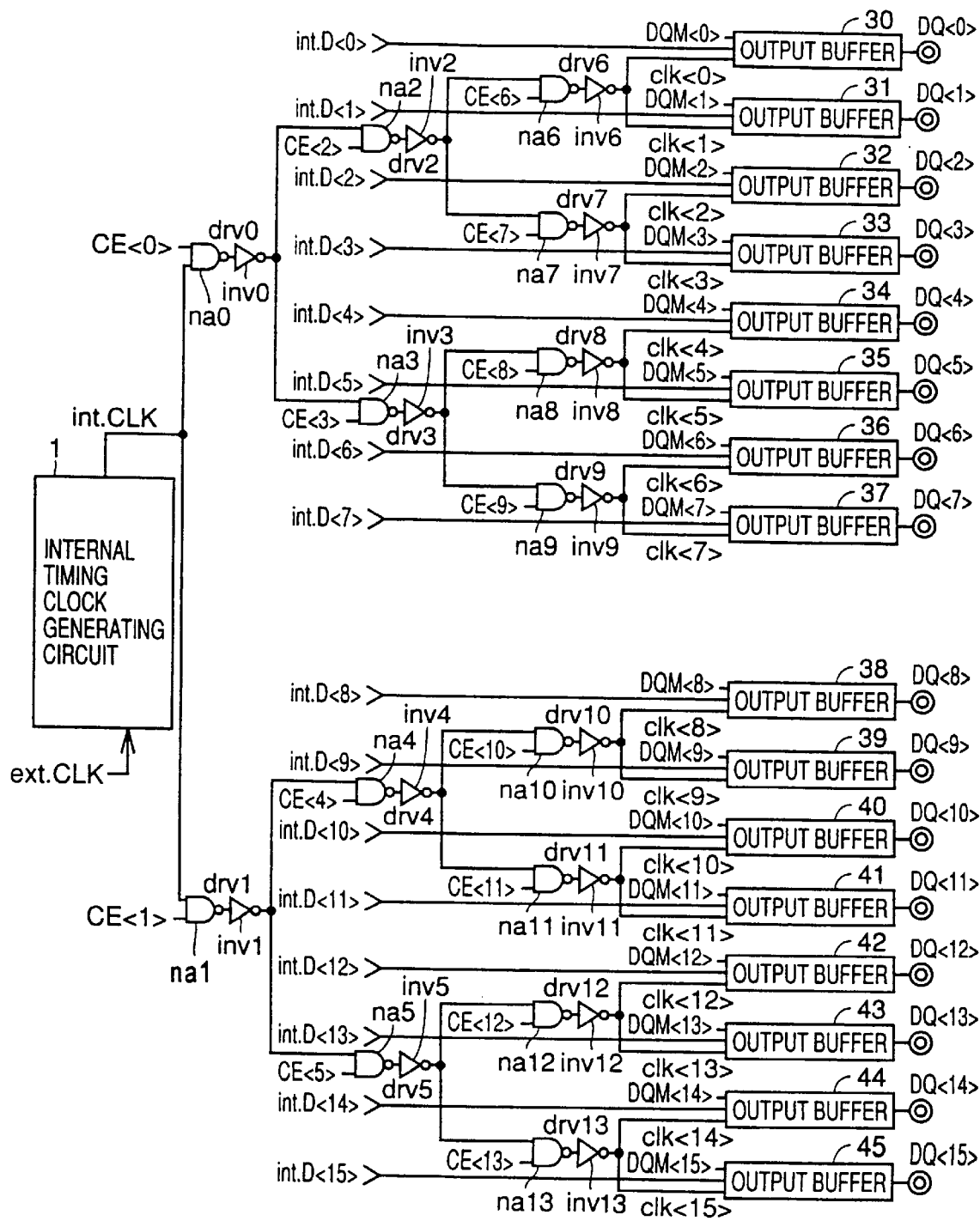
FIG. 6 is a block diagram of a binary clock buffer and an output buffer allowing byte control in accordance with another embodiment of the present invention.

FIG. 6 is a block diagram showing another embodiment of the present invention. In the embodiment shown in FIG. 6, every driver circuit at the branching point of the binary tree is constituted by an NAND gate and an inverter. More specifically, driver circuits drv0, drv2, drv3, drv6, drv7, drv8 and drv9 are constituted by NAND gates na0, na2, na3, na6, na7, na8 and na9 and inverters inv0, inv2, inv3, inv6, inv7, inv8 and inv9, respectively. To one input end of each of the NAND gates na0, na2, na3, na6, na7, na8 and na9, internal clock signal int.CLK is applied from the preceding stage, and to the other input end, control signals CE<0>, CE<2>, CE<3>, CE<6>, CE<7>, CE<8> and CE<9> for stopping operation of the clock signal are input, respectively.

Similarly, driver circuits drv1, drv4, drv5, drv10, drv11, drv12 and drv13 are constituted by NAND gates na1, na4, na5, na10, na11, na12 and na13 and inverters inv1, inv4, inv5, inv10, inv11, inv12 and inv13, respectively. To one input end of each of the NAND gates na1, na4, na5, na10, na11, na12 and na13, internal clock signal int.CLK is applied from the preceding stage, and to the other input end, control signals CE<1>, CE<4>, CE<5>, CE<10>, CE<11>, CE<12> and CE<13> for stopping operation of the clock signal are applied, respectively.

Figure 7:
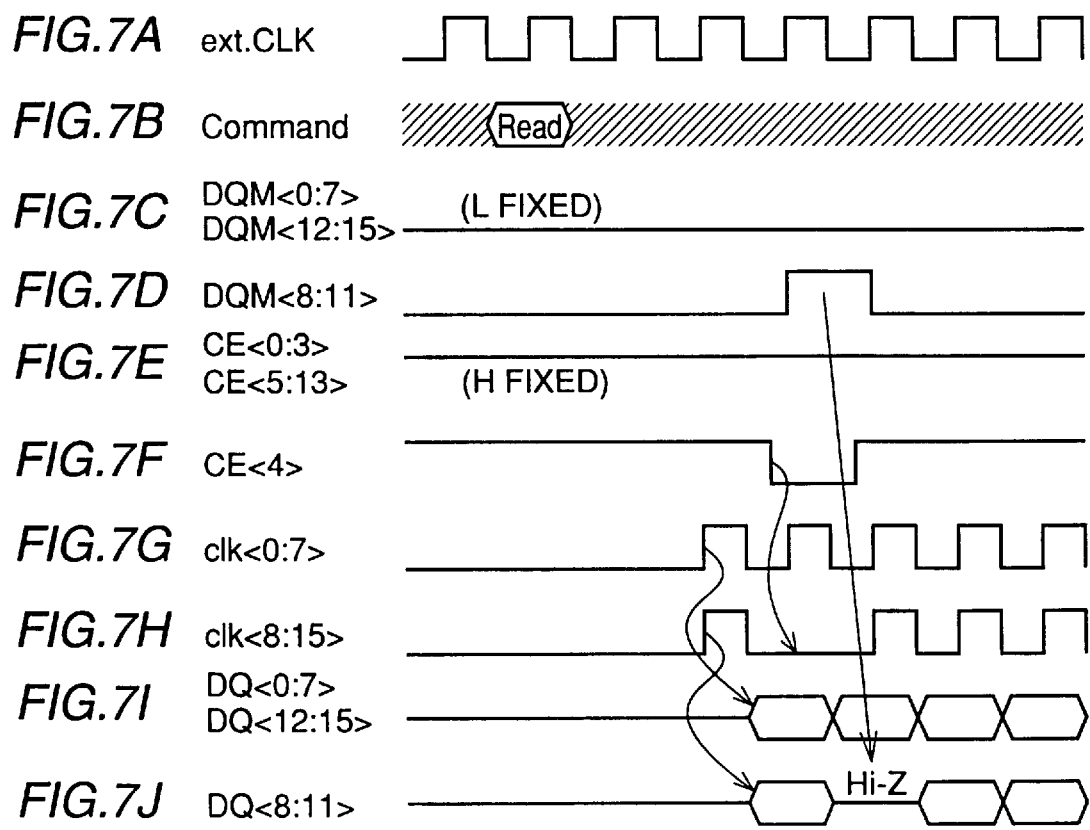
FIGS. 7A to 7J are timing charts showing timings of internal clock signals and data outputs at the time of byte control in accordance with the embodiment shown in FIG. 5.
Figure 8:
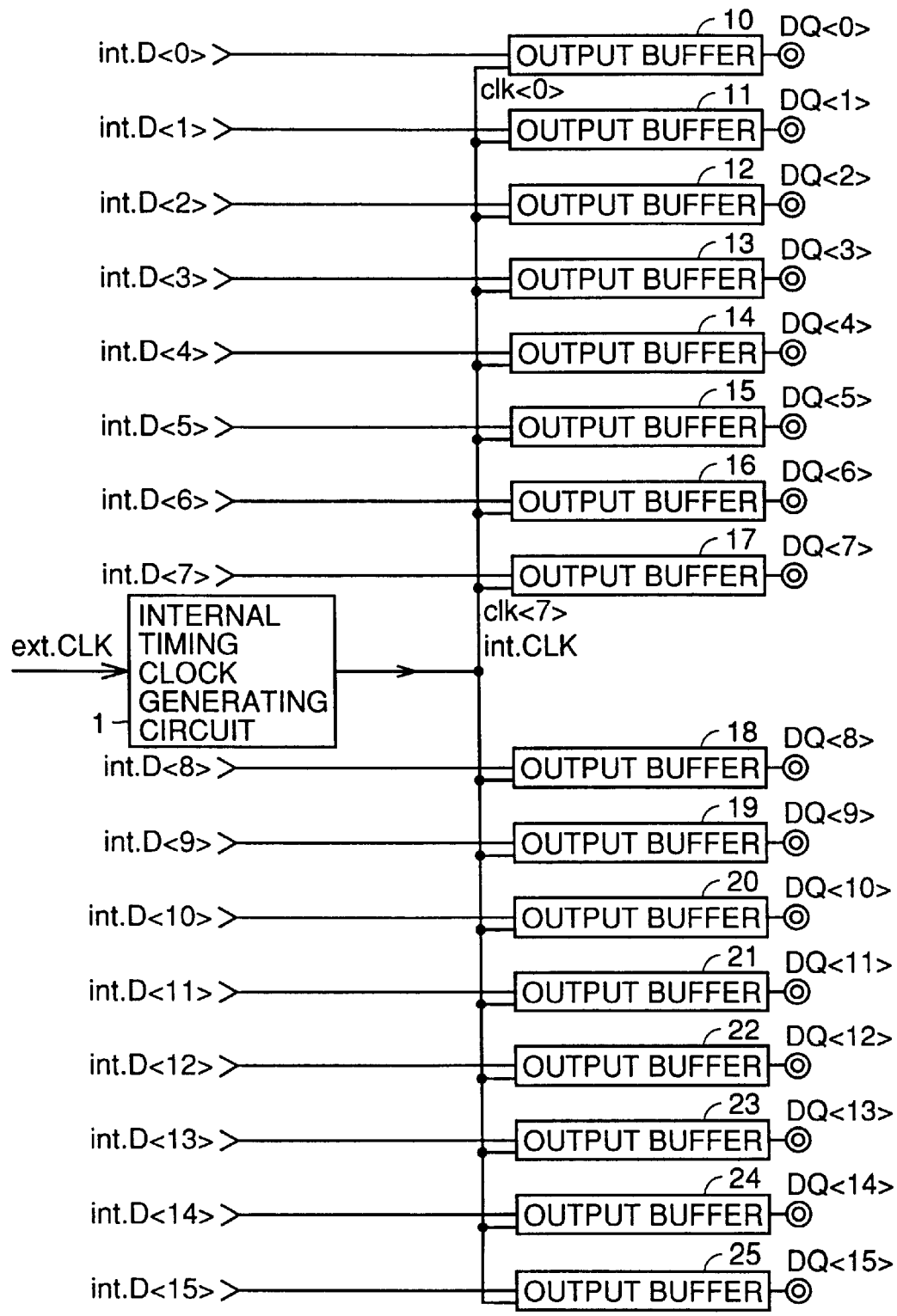
FIG. 8 is a block diagram showing a conventional circuit for distributing clocks to output buffers.
Figure 9:
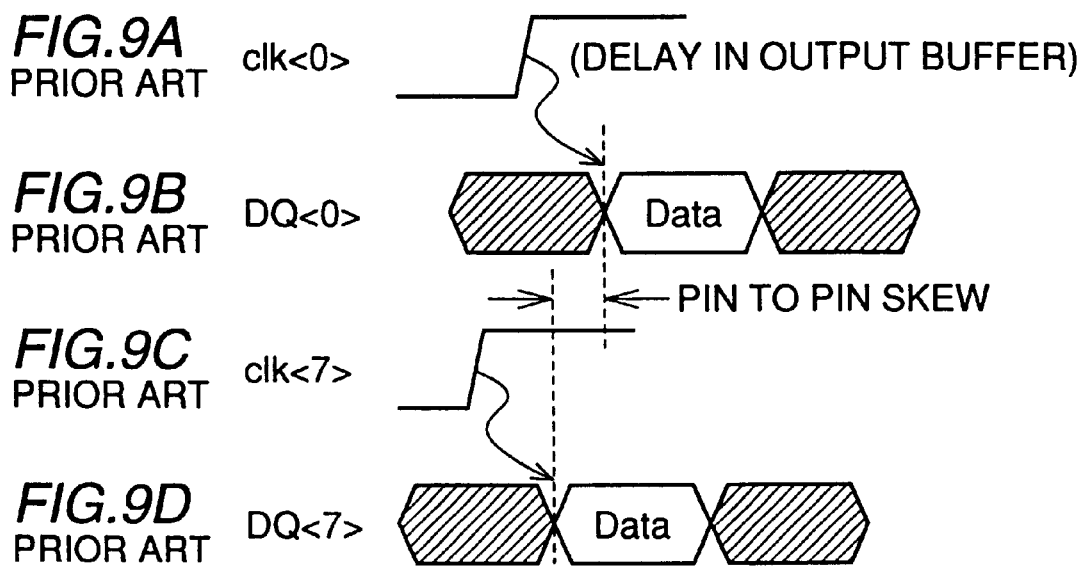
FIGS. 9A to 9D are timing charts showing timing of data outputs of the circuit shown in FIG. 8.
Figure 10:
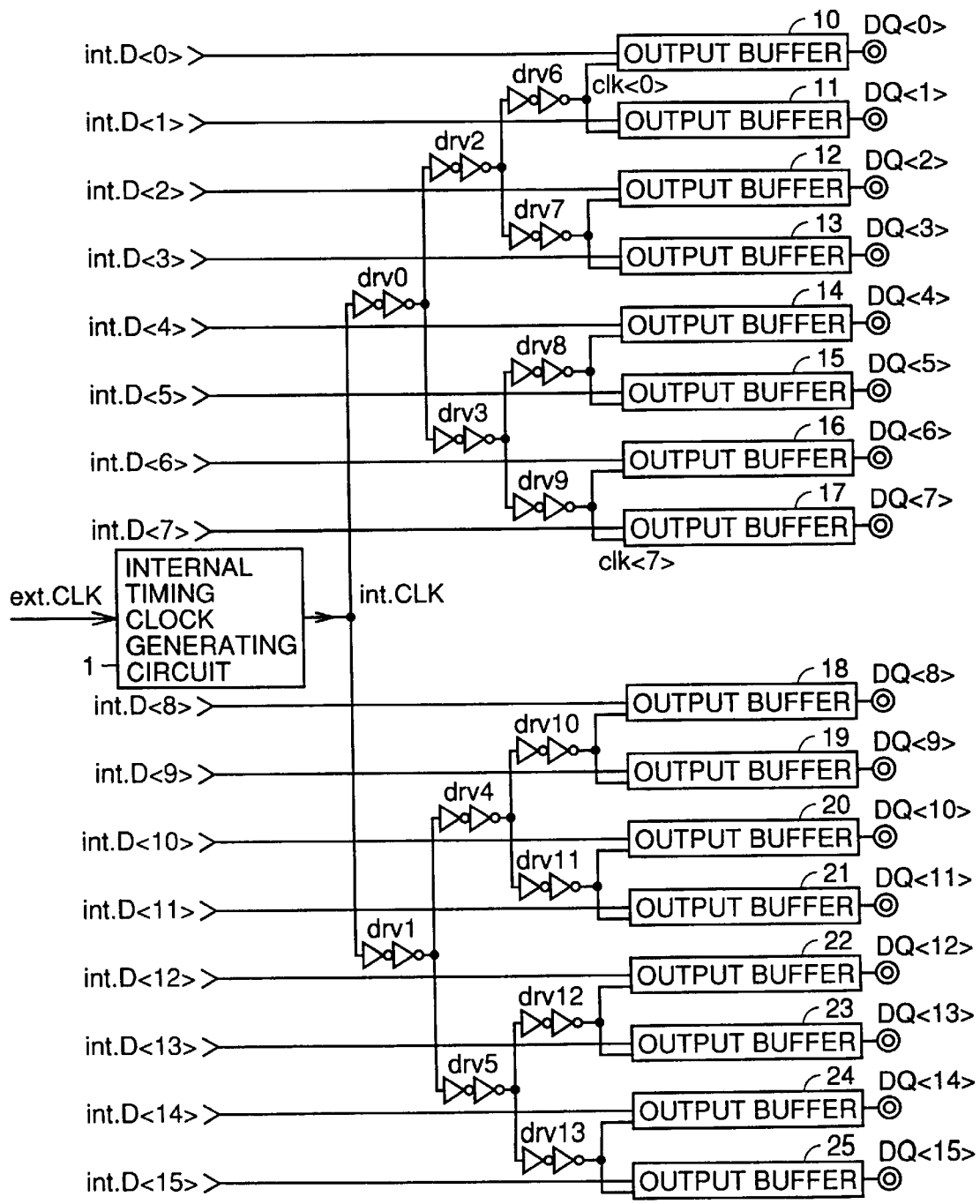
FIG. 10 shows a conventional binary clock distributing circuit for output buffers.
Figure 12:
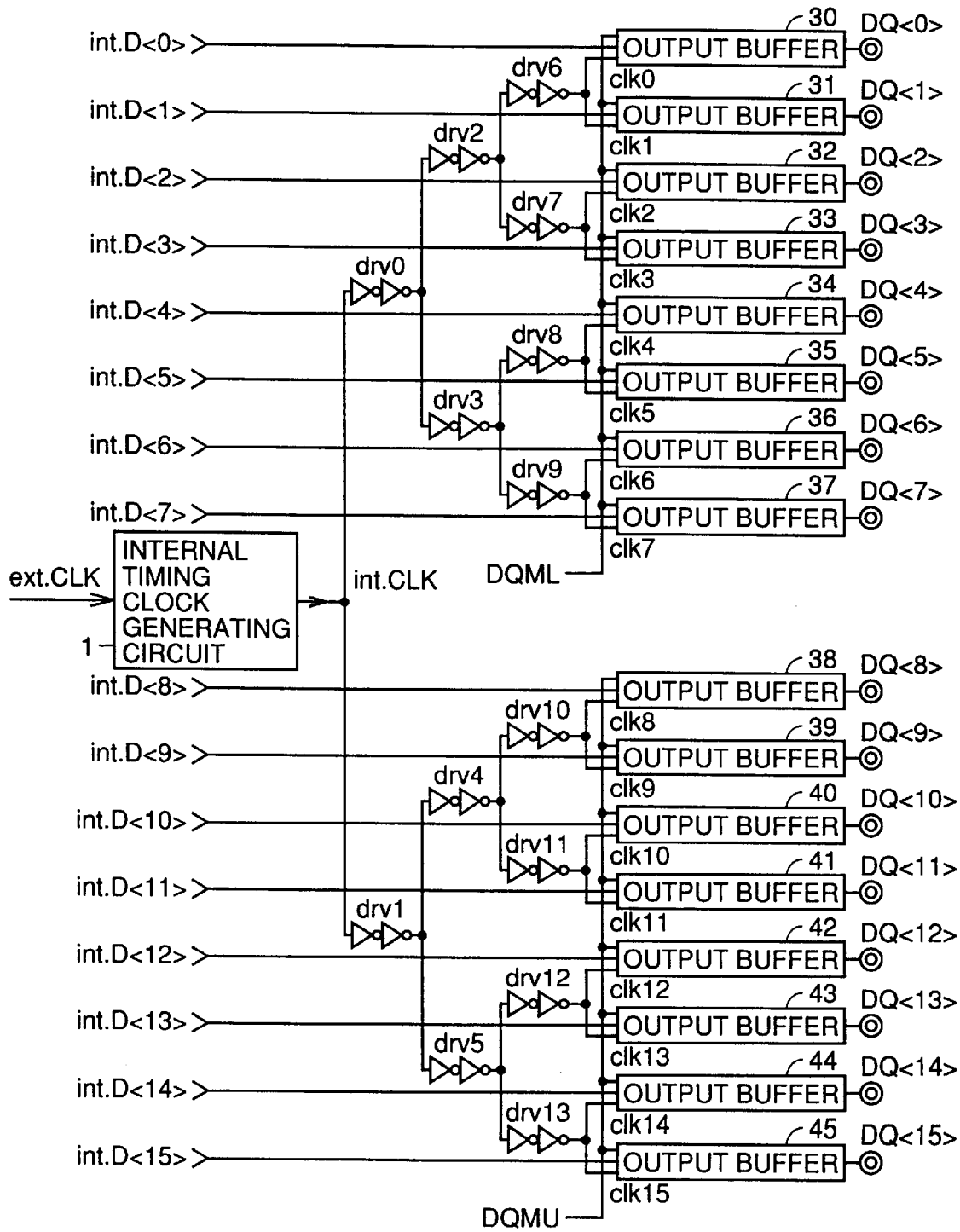
FIG. 12 is a block diagram showing a binary clock distributing circuit to output buffers allowing byte control.

FIGS. 7A to 7J are timing charts related to the operation of the output buffers shown in FIG. 6. For example, assume that 4 bits of read data of data outputs DQ<8> to DQ<11> shown in FIG. 7J are to be temporarily stopped. At this time, by setting stopping signal CE<4> shown in FIG. 7F to the "L" level, the clock signal is stopped as shown in FIG. 7H. Thus operational current of driver circuits drv10 and drv11 can be reduced.

When the clock signal is stopped by the stopping signal CE and not by the high impedance output provided in response to the signal DQM, the data of the output corresponding to the stopped tree section is held. Therefore, power consumption of the clock tree is conveniently reduced when an arbitrary bit output is to be maintained.

The embodiment shown in FIG. 6 may similarly be applied to clock tree for data input. In that case, when continuous even-numbered bit inputs are to be masked, part of the tree to the input buffers corresponding to the aforementioned bits is stopped, whereby power consumption can be reduced. Therefore, according to the present embodiment, the tree block of which operation is to be stopped can be selected arbitrarily, and input/output can be controlled bit by bit.

Though the present invention has been applied to the synchronous semiconductor memory device handling 16 bits of data, the application is not limited thereto. The present invention is similarly applicable to synchronous semiconductor memory devices handling data of 16 bits or more, and the embodiment shown in FIG. 6 is effective when applied to synchronous semiconductor memory devices handling data of 4 bits or more.

As described above, according to the embodiments of the present invention, in a binary clock tree for branching a clock signal and outputting to a plurality of buffer circuits, supply of the clock signal is stopped in accordance with an external control signal, so that power consumption is reduced. Further, when input/output is to be controlled bit by bit and input or output of two or more bits is to be stopped, the clock tree block which is to be stopped can arbitrarily be selected, and power consumption of the clock tree is reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device for temporarily stopping data output from a plurality of output terminals by a control signal at continuous data input or output, comprising:

a plurality of buffer circuits for outputting data to respective ones of said plurality of output terminals based on a clock signal;

a clock signal supplying circuit for branching and applying said clock signal to each buffer circuit at same timing; and a supply stop circuit for stopping supplying of the clock signal from said clock signal supplying circuit to at least one of said plurality of buffer circuits in response to said control signal.

2. The synchronous semiconductor memory device according to claim 1, wherein said clock signal supplying circuit includes a plurality of driver circuits provided for respective branches, and said supply stop circuit includes a gate circuit provided at a first stage of said plurality of driver circuits for stopping output of said clock signal in response to said control signal.

3. The synchronous semiconductor memory device according to claim 1, wherein said clock signal supplying circuit includes a plurality of driver circuits provided for respective branches, and said supply stop circuit includes a gate circuit provided on an input side of each of said driver circuits, for stopping output of said clock signal from each driver circuit in response to said control signal.

4. The synchronous semiconductor memory device according to claim 1, wherein said supply stop circuit stops supply of the clock signal byte by byte in response to said control signal.

5. The synchronous semiconductor memory device according to claim 1, wherein said supply stop circuit stops supplying of the clock signal bit by bit in response to said control signal.

* * * * *